United States Patent
Cui et al.

(10) Patent No.: US 12,352,783 B2
(45) Date of Patent: Jul. 8, 2025

(54) ELECTRICITY METER ASSEMBLY FOR OPEN AND SHORT CIRCUIT DETECTION

(71) Applicant: ACCUENERGY (CANADA) INC., Toronto (CA)

(72) Inventors: Shaohang Cui, Toronto (CA); Yufan Wang, Toronto (CA); Ketao Li, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 198 days.

(21) Appl. No.: 18/465,158

(22) Filed: Sep. 12, 2023

(65) Prior Publication Data
US 2025/0085313 A1   Mar. 13, 2025

(51) Int. Cl.
*G01R 11/067* (2006.01)
*G01R 11/04* (2006.01)
(Continued)

(52) U.S. Cl.
CPC ............ *G01R 11/067* (2013.01); *G01R 11/04* (2013.01); *G01R 21/1333* (2013.01); *G01R 22/063* (2013.01)

(58) Field of Classification Search
CPC ....... G01R 11/02; G01R 11/06; G01R 11/067; G01R 11/48–54; G01R 21/133;
(Continued)

(56) References Cited

U.S. PATENT DOCUMENTS 6,275,168 B1 * 8/2001 Slater .................. G01R 22/065
324/156
8,847,573 B2   9/2014 Vangool
(Continued)

FOREIGN PATENT DOCUMENTS

| CN | 115118013 A | 9/2022 |
|---|---|---|
| CN | 115754879 A | 3/2023 |
| CN | 116299044 A | 6/2023 |

OTHER PUBLICATIONS

Acuvim-II-Power-Meter-User-Manual; May 2023; https://accucdn.accuenergy.com/wp-content/uploads/Acuvim-II-Power-Meter-User-Manual-1040E1303.pdf.
(Continued)

*Primary Examiner* — Huy Q Phan
*Assistant Examiner* — David B Frederiksen
(74) *Attorney, Agent, or Firm* — Dhiraj Jindal; PATENT YOGI LLC

(57) ABSTRACT

The present invention relates to an electricity meter assembly including a sensor module to connect to an electrical system, a meter, and a removable expansion module. The sensor module receives voltage and current signals, generating corresponding measurement signals. The meter's measurement module processes these signals, generating energy consumption data and determining short and open circuit conditions. The removable expansion module, guided by the meter, produces a detection current of a specific frequency, distinct from the electrical system's signals. Also disclosed is a specific configuration of the removable expansion module, designed to attach to a power meter, with components for control, generation, and transmission of specific AC signals.

12 Claims, 7 Drawing Sheets

(51) Int. Cl.
*G01R 21/133* (2006.01)
*G01R 22/06* (2006.01)

(58) Field of Classification Search
CPC ............... G01R 21/1333; G01R 22/04; G01R 22/06–068; G01R 31/50; G01R 31/52; G01R 31/62; G01R 35/04
See application file for complete search history.

(56) References Cited

U.S. PATENT DOCUMENTS

| | | | |
|---|---|---|---|
| 2017/0122995 A1* | 5/2017 | Voisine, Jr. | G01K 7/16 |
| 2019/0120885 A1* | 4/2019 | Kraus | G01R 22/066 |
| 2023/0069041 A1 | 3/2023 | Khan | |

OTHER PUBLICATIONS

Acuvim II Series Power Meter AXM WEB2, May 2021, https://accucdn.accuenergy.com/wp-content/uploads/AXM-WEB2-user-manual.pdf.

* cited by examiner

ELECTRICITY METER ASSEMBLY FOR OPEN AND SHORT CIRCUIT DETECTION

FIELD OF THE INVENTION

The present invention generally relates to electrical devices, more specifically, to an electricity meter assembly. The invention also relates to a removable expansion module.

BACKGROUND OF THE INVENTION

Traditional electricity meters are commonly used for measuring energy consumption in residential, commercial, and industrial settings. These meters typically consist of sensor modules that incorporate current and/or potential transformers to measure voltage and current signals from an electrical system. However, conventional systems often fall short in detecting electrical anomalies such as open circuits and short circuits, which may be detrimental to both the electrical system and the meter itself.

Modifications or expansions to conventional electricity meters often require substantial alterations to the hardware, making it inconvenient and costly. Removable or auxiliary modules have been proposed, but these often are limited in functionality, complex to install, or not fully integrated into the metering system.

There is therefore a need for an improved electricity meter assembly that not only performs the basic functions of energy consumption measurement but also incorporates enhanced features for detecting electrical anomalies.

SUMMARY OF THE INVENTION

The present invention addresses the shortcomings of existing electricity metering technologies by providing an innovative electricity meter assembly and a removable expansion module that enhance both functionality and adaptability. The invention allows for more accurate energy consumption measurements, and importantly, enables the detection of electrical anomalies like open circuits and short circuits in an electrical system.

In one embodiment, the electricity meter assembly comprises three main components:

A sensor module configured to connect to an electrical system. The sensor module incorporates at least one current transformer and/or potential transformer to measure voltage and current signals from the connected electrical system and generate corresponding measurement signals.

A meter, equipped with a measurement module, that receives the measurement signals from the sensor module to calculate energy consumption data. The meter includes means for coupling with the sensor module to facilitate the electrical connection. Additionally, the measurement module is configured to determine short circuit and open circuit conditions based on a detection current received from a removable expansion module.

A removable expansion module featuring a signal generator module capable of generating a detection current at a frequency distinct from that of the electrical system. The expansion module includes means for coupling to the sensor module, allowing the signal generator module to connect to the at least one current transformer and/or potential transformer.

In another embodiment, a removable expansion module designed for physical and electrical attachment to a power meter is described. This module contains:

A communication interface facilitating bidirectional communication with the power meter, operable to receive control signals.

A Microcontroller Unit (MCU) that is coupled to the communication interface and processes received control signals to determine the desired frequency and amplitude of a sinusoidal AC signal.

A signal generator controlled by the MCU to generate an initial sinusoidal AC signal with specified amplitude and frequency.

A frequency control unit to receive and adjust the initial sinusoidal AC signal's frequency as instructed by the MCU.

An output terminal to receive the final frequency-modulated sinusoidal AC signal and transmit it to an associated system.

Through these embodiments, the invention offers a flexible, adaptable, and functionally enhanced solution for electricity metering.

DETAIL DESCRIPTIONS OF THE INVENTION

Figure 1:
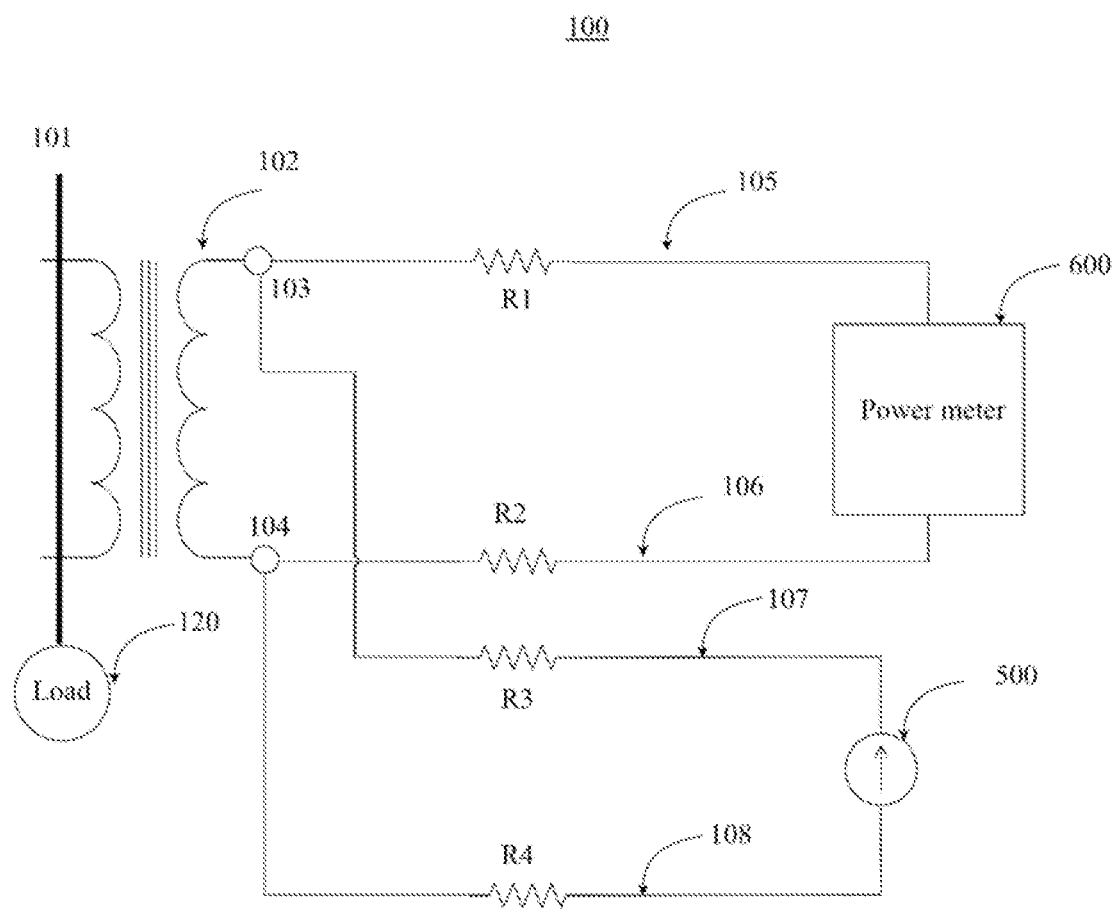
FIG. 1 is a schematic diagram of an instrument transformer short circuit and open circuit detection system according to some embodiments of the present invention.

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

In the accompanying figures of the present disclosure, identical numerals are used to denote elements that are functionally or structurally equivalent. This approach ensures that elements with the same characteristics are consistently labeled with the same reference numerals across different figures, thereby enhancing the clarity and coherence of the invention's description.

FIG. 1 is a schematic diagram of an instrument transformer short circuit and open circuit detection system 100, in accordance with one or more embodiments of the present invention. The system 100 includes an instrument transformer 102, a power meter 600, and an expansion module 500.

The instrument transformer 102 is operative to step down the voltage or current within an electrical system to a magnitude that can be readily measured and analyzed by instruments such as meters and relays. It is configured to be implemented as either a current transformer or a potential transformer, depending upon the specific application. Herein, the instrument transformer 102 will be described using a current transformer as an illustrative example; however, the principles and features described herein are equally applicable to potential transformers, as would be recognized by those skilled in the art. The instrument transformer 102, incorporated within a sensor module, generates corresponding measurement signals by stepping down the voltage or current received from the electrical system. In certain embodiments, the sensor module is equipped with 3 current transformers and 3 potential transformers, tailored to function within a 3-phase, 4-wire electrical system. Alternatively, in other embodiments, the sensor module may comprise solely 3 current transformers for collecting current signals within a 3-phase, 4-wire system, and there are no potential transformers, as the voltage signal is collected directly from the power line.

In the depicted embodiment, the system 100 further includes a pair of wires 105, 106 that facilitate connection between the power meter 600 and secondary terminals 103, 104, which are integral parts of the current transformer 102. These secondary terminals 103, 104 are designed to transmit signals corresponding to the secondary winding of the current transformer 102. The current transformer 102 is in turn coupled to a primary conductor 101 in the electrical system, supplying power to a load 120, such as an Electric Vehicle. R1 and R2 denote the equivalent resistances of wires 105 and 106, respectively.

The system 100 also incorporates wires 107 and 108, configured to individually connect the expansion module 500 to the secondary terminals 103 and 104. Here, R3 and R4 signify the equivalent resistances of wires 106 and 107, respectively.

The expansion module 500 is characterized as a removable add-on component designed for integration with the power meter 600. Although the expansion module 500 and the power meter 600 are intended to be interconnected within the context of FIG. 1, they are illustrated separately for the sake of clarity. Communication between the power meter 600 and the expansion module 500 is achieved via an interface, such as the I2C protocol. Under the guidance of the power meter 600, the expansion module 500 can generate a detection current signal at a frequency distinct from the current signal and voltage signal in the primary conductor 101, thereby minimizing the likelihood of mutual interference.

The power meter 600 comprises a measurement module 620, which is operable to receive the measurement signals from the sensor module and subsequently generate energy consumption data. Additionally, the measurement module is specifically configured to evaluate the short circuit and open circuit conditions pertaining to the at least one current transformer and/or potential transformer. This evaluation is based on the detection current received from the removable expansion module.

Figure 2:
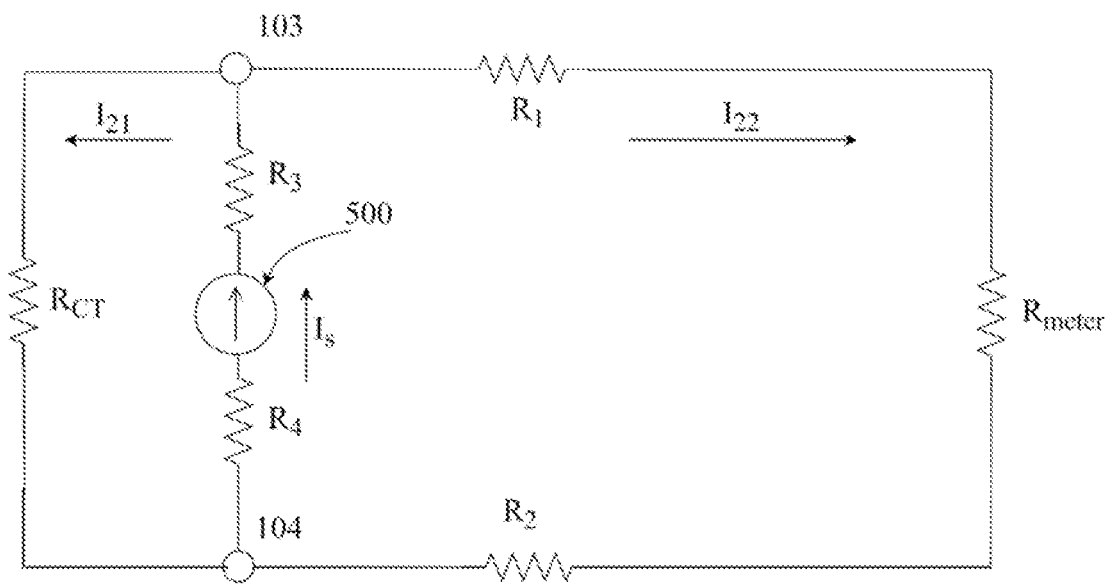
FIG. 2 is a diagram of equivalent circuit representing the instrument transformer short circuit and open circuit detection system according to some embodiments of the present invention.

FIG. 2 illustrates a diagram of equivalent circuit 200 representing the instrument transformer short circuit and open circuit detection system 100, in accordance with one or more embodiments of the present invention.

Within this equivalent circuit 200, the notation $R_{CT}$ symbolizes the equivalent resistance specifically associated with the current transformer 102, encapsulating all inherent resistive components within the current transformer itself. It provides a simplified representation for understanding the electrical behavior of the current transformer 102. $R_{meter}$ denotes the equivalent resistance of the power meter 600, summarizing the resistive elements found within the meter's circuitry. This representation aids in the analysis of the meter's performance and its interaction with other components of the system 100.

Additionally, the term $I_s$ represents a detection current generated by the expansion module 500. This particular detection current, subject to the control of the power meter 600, is designed to identify both open circuit and short circuit conditions within the current transformer 102. The frequency and magnitude of this detection current are modifiable, a feature that ensures minimal or no interference with other current signals present within system 100.

$I_{22}$ is defined as the current flowing within a specific loop that encompasses $R_{meter}$, $R_1$, $R_2$, $R_3$, and $R_4$ when the system 100 operates under normal conditions, devoid of any short circuit or open circuit anomalies. $I_{22}$ is also the received detection current from the expansion module 500. During this normal operational state, the characteristics of $I_{22}$, including its amplitude, phase, and waveform, are monitored and recorded by the power meter 600. In FIG. 2, $I_{22}$ can be approximated as the following:

$$I_{22} = \frac{R_{CT}}{R_1 + R_2 + R_{meter} + R_{CT}} I_s$$

This recorded information regarding $I_{22}$ is stored within the power meter 600 as a reference current. This reference current serves as a baseline for subsequent analyses and is integral to the functionality of the short circuit and open circuit detection system 100. Should any deviation from this reference current be detected in the future, it may indicate a potential fault, such as a short circuit or open circuit, thereby triggering an alert or other responsive actions as designed within the system 100.

By using this equivalent circuit 200 and the associated reference current methodology, the system 100 offers an efficient and robust mechanism for monitoring the integrity of the electrical connections and promptly detecting any irregularities. The standardized representation provided in FIG. 2 aids those skilled in the art in understanding the underlying principles of the invention and its practical implementation in various applications.

Figure 3:
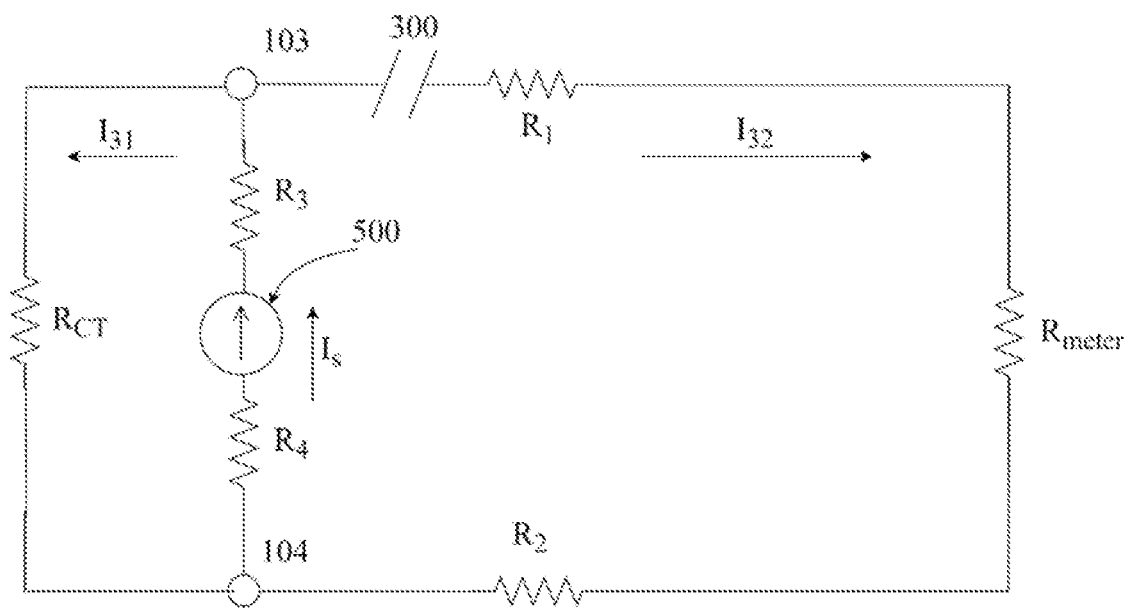
FIG. 3 is a diagram of equivalent circuit representing the instrument transformer short circuit and open circuit detection system with an open circuit condition according to some embodiments of the present invention.

FIG. 3 illustrates a diagram of equivalent circuit with an open circuit condition, in accordance with one or more embodiments of the present invention. The schematic in FIG. 3 provides a comprehensive view of the system 100's behavior when an open circuit fault occurs, offering insights into the detection and response mechanisms.

In the depiction of FIG. 3, an open circuit is identified at location 300 within the current transformer 102. An open circuit at this location can occur due to various reasons such as a disconnection, a break in the wire, or any other failure that leads to an interruption in the electrical path.

The current $I_{32}$ is defined as the current flowing within a specific loop that encompasses the equivalent resistances $R_{meter}$, $R_1$, $R_2$, $R_3$, and $R_4$ when the current transformer 102 is operating under the influence of open circuit 300. This current $I_{32}$ is the received detection current from the expansion module 500 and serves as an essential parameter in the identification and analysis of the open circuit condition. The current $I_{32}$, as a specific component of the detection current $I_s$ flowing through power meter 600, can be approximated as the following:

$$I_{32} = \frac{R_{CT}}{R_{300+}R_1 + R_2 + R_{meter} + R_{CT}} I_s$$

where $R_{300}$ represents the equivalent resistance corresponding to location 300.

Upon the detection of the open circuit, the power meter 600 will receive the current $I_{32}$. It may subsequently calculate the Root Mean Square (RMS) current based on this current $I_{32}$. The RMS current is a significant parameter representing the effective value of the total current waveform, and its computation involves squaring the current values, calculating the mean, and then taking the square root of that mean.

The power meter 600 then compares the calculated RMS current with a predefined threshold value. This threshold is intentionally set near to zero, considering that the occurrence of an open circuit generally results in a significant drop in current flow through the affected loop. If the RMS current falls below this threshold, the power meter 600 will definitively determine that an open circuit fault has occurred within the current transformer 102.

Upon confirming the open circuit, the power meter 600 may initiate pre-programmed actions or alerts to notify the relevant personnel or systems. These responsive measures might include isolating the affected circuit, engaging redundant systems, or triggering maintenance protocols, depending on the specific design and requirements of the current transformer 102.

This open circuit detection mechanism, as illustrated and described with reference to FIG. 3, represents a novel and efficient approach to identifying and managing open circuit faults within the current transformer 102. By monitoring the current flow and comparing it against a defined threshold, the current transformer 102 ensures a timely response to open circuit conditions, minimizing potential damage and downtime. The mechanism for detecting open circuit conditions is incorporated into the measurement module of the power meter 600. This measurement module is realized through a combination of software and hardware implementations.

Figure 4:
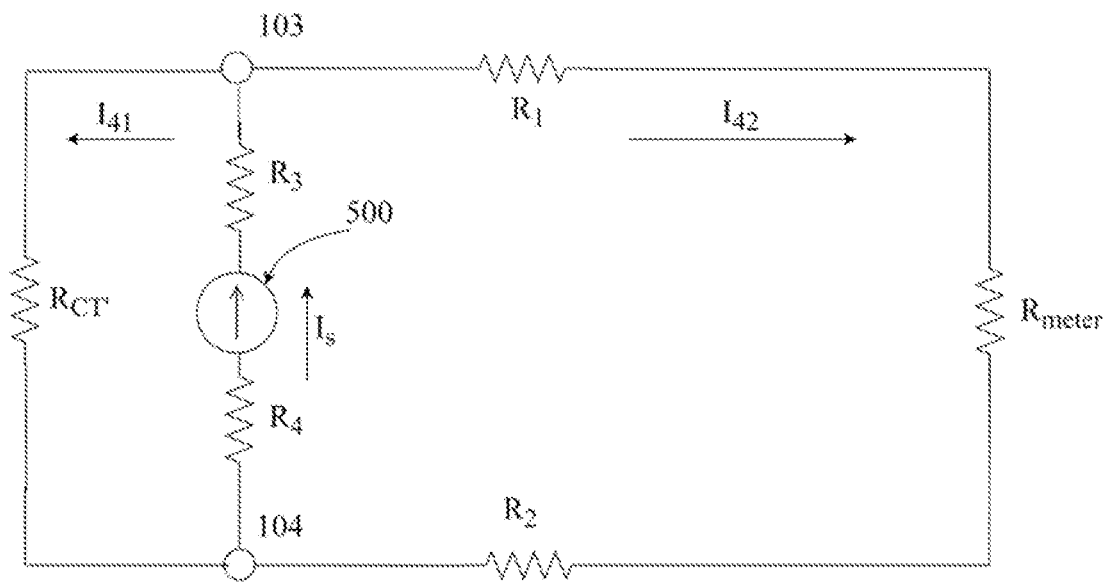
FIG. 4 is a diagram of equivalent circuit representing the instrument transformer short circuit and open circuit detection system with a short circuit condition according to some embodiments of the present invention.

FIG. 4 illustrates a diagram of equivalent circuit 200 with a short circuit condition, in accordance with one or more embodiments of the present invention. This figure represents a specific scenario where the equivalent circuit 200 undergoes a short circuit fault, providing insights into how the system 100 responds to and detects such occurrences.

In FIG. 4, the equivalent resistance $R_{CT'}$ of the current transformer 102 under a short circuit condition is considerably lower than the normal equivalent resistance (represented as $R_{CT}$ in previous figures). A short circuit can be described as an unintended connection that provides a path of very low resistance, thereby causing a drastic increase in current flow through that path. In the context of the current transformer 102, this means that the overall resistance in the transformer will decrease sharply.

The current $I_{42}$ is defined as the current flowing within a specific loop that encompasses the equivalent resistances $R_{meter}$, $R_1$, $R_2$, $R_3$, and $R_4$ when the current transformer 102 operates under the short circuit condition. Due to the reduced resistance caused by the short circuit, $I_{42}$ will become smaller than the reference current $I_{22}$ (previously defined under normal operating conditions). The current $I_{42}$, as a specific component of the detection current $I_s$ flowing through power meter 600, can be approximated as the following:

$$I_{42} = \frac{R_{CT}}{R_1 + R_2 + R_{meter} + R_{CT'}} I_s$$

Upon the occurrence of the short circuit, the power meter 600 will receive the current $I_{42}$. It may then calculate the Root Mean Square (RMS) current based on this current $I_{42}$. The RMS current represents the quadratic mean of the current and serves as an essential parameter in analyzing the waveform's effective value.

The calculated RMS current will then be compared to a predefined short circuit threshold. This short circuit threshold is a value determined by the reference current collected in the normal state ($I_{22}$). If the calculated RMS current is smaller than this determined short circuit threshold, the power meter 600 will conclusively identify that a short circuit has occurred within the current transformer 102.

During this normal operational state, the characteristics of $I_{22}$, including its amplitude, phase, and waveform, are monitored and recorded by the power meter 600. This recorded information regarding $I_{22}$ is stored within the power meter 600 as a reference current. The data collection process is designed to capture a representative sample of the normal operational state, thereby enabling accurate comparisons during abnormal conditions like short circuits.

The processing of the recorded data in the system involves several computational steps to ensure accuracy and relevance. First, a data smoothing technique is applied to reduce the noise and fluctuations present in the raw data. This might involve employing a moving average filter, a Gaussian filter, or any suitable statistical method that refines the data and extracts the underlying trend. By smoothing, more accurate analysis and thresholding are made possible.

Following data smoothing, the refined data is used to calculate the Root Mean Square (RMS) current of $I_{22}$. The RMS value provides a meaningful representation of the effective current, taking into consideration both the magnitude and phase information. This calculation involves squaring the instantaneous values of the current, averaging these squared values over a defined period, and then taking the square root of the average. The RMS calculation represents a critical step in assessing the electrical characteristics of the current in the system.

Lastly, the calculated RMS value of $I_{22}$ is used to determine a short circuit threshold for short circuit detection. This threshold can be fine-tuned according to specific system requirements and regulations by applying safety margins or coefficients. By systematically applying these computational methods, the system can accurately detect abnormal conditions such as short circuits and respond appropriately, adding an essential layer of protection and control.

Upon detection of the short circuit, the power meter 600 may initiate various responsive actions according to the design and needs of the system 100. These actions might include immediate isolation of the affected circuit, activation of protection mechanisms, notification to control centers, or any combination thereof.

The mechanism for detecting short circuit conditions is incorporated into the measurement module of the power meter 600. This measurement module is realized through a combination of software and hardware implementations. The measurement module includes a threshold determination module that establishes a predefined short circuit threshold for determining a short circuit condition.

The methodology described in FIG. 4 provides a robust and sensitive mechanism for short circuit detection. By monitoring the equivalent resistance of the current transformer 102 and applying an adaptive threshold based on normal-state reference current, the system 100 ensures accurate and prompt detection of short circuit faults.

Figure 5:
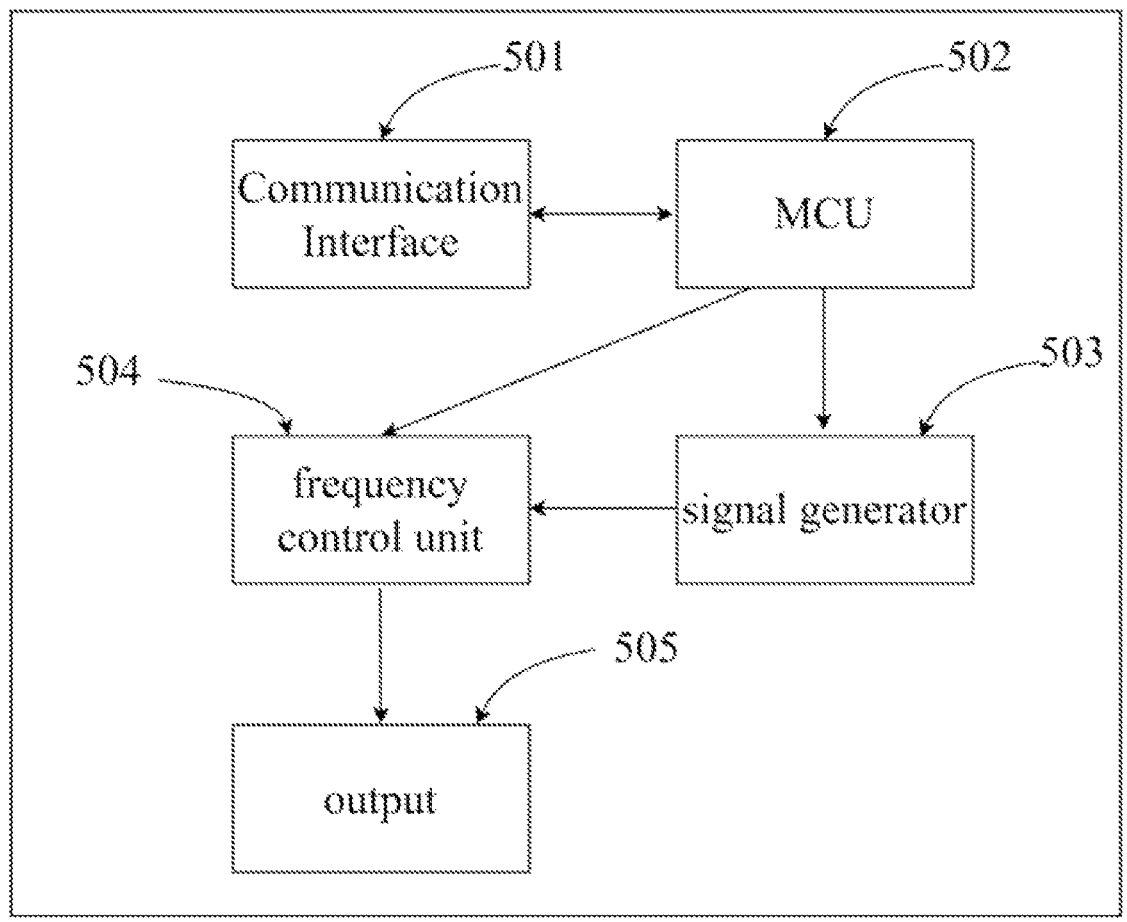
FIG. 5 is a block diagram illustrating an expansion module 500 according to some embodiments of the present invention.

FIG. 5 illustrates a block diagram of expansion module 500, in accordance with one or more embodiments of the present invention. The expansion module 500 is designed to generate a specified sinusoidal alternating current (AC) signal, whose frequency and magnitude can be dynamically controlled through interaction with power meter 600.

The communication interface 501 may be an I2C interface (Inter-Integrated Circuit protocol) or other suitable communication protocol. It facilitates bidirectional communication with power meter 600, allowing the transmission of control signals such as frequency, magnitude, phase, and waveform attributes to the MCU (Microcontroller Unit) 502.

MCU 502 receives and processes the control signals from communication interface 501, including the desired frequency and amplitude of the sinusoidal AC signal. It sends specific instructions to both the signal generator 503 and frequency control unit 504 based on the received parameters.

The signal generator 503, under the direct control of MCU 502, generates the initial sinusoidal AC signal with a specified amplitude and initial frequency. It may include a waveform generator circuit, a digital-to-analog converter, or other specialized components to achieve precise sinusoidal waveform generation.

The frequency control unit 504 receives the initial sinusoidal AC signal from signal generator 503 and adjusts its frequency as instructed by MCU 502. It may employ phase-locked loops (PLL), frequency synthesizers, variable-frequency oscillators, or other suitable techniques to modify the signal frequency to the desired level, ensuring adaptive and responsive control.

The frequency control unit 504 and the signal generator 503 constitutes a signal generator module to generate a detection current for detecting open circuit and short circuit within a transformer current.

The output terminal 505 receives the final frequency-modulated sinusoidal AC signal from frequency control unit 504 and sends it to system 100. It may include protection circuits, impedance matching, or other features to ensure compatibility with the receiving system.

The described architecture and functionality of expansion module 500 allow for precise and adaptive generation and control of sinusoidal AC signals. The integration of various components enables efficient communication and coordination between elements, achieving the desired signal characteristics. Such a module may find applications in various fields, such as power monitoring, communication systems, or instrumentation, where precise signal generation and control are paramount.

Figure 6:
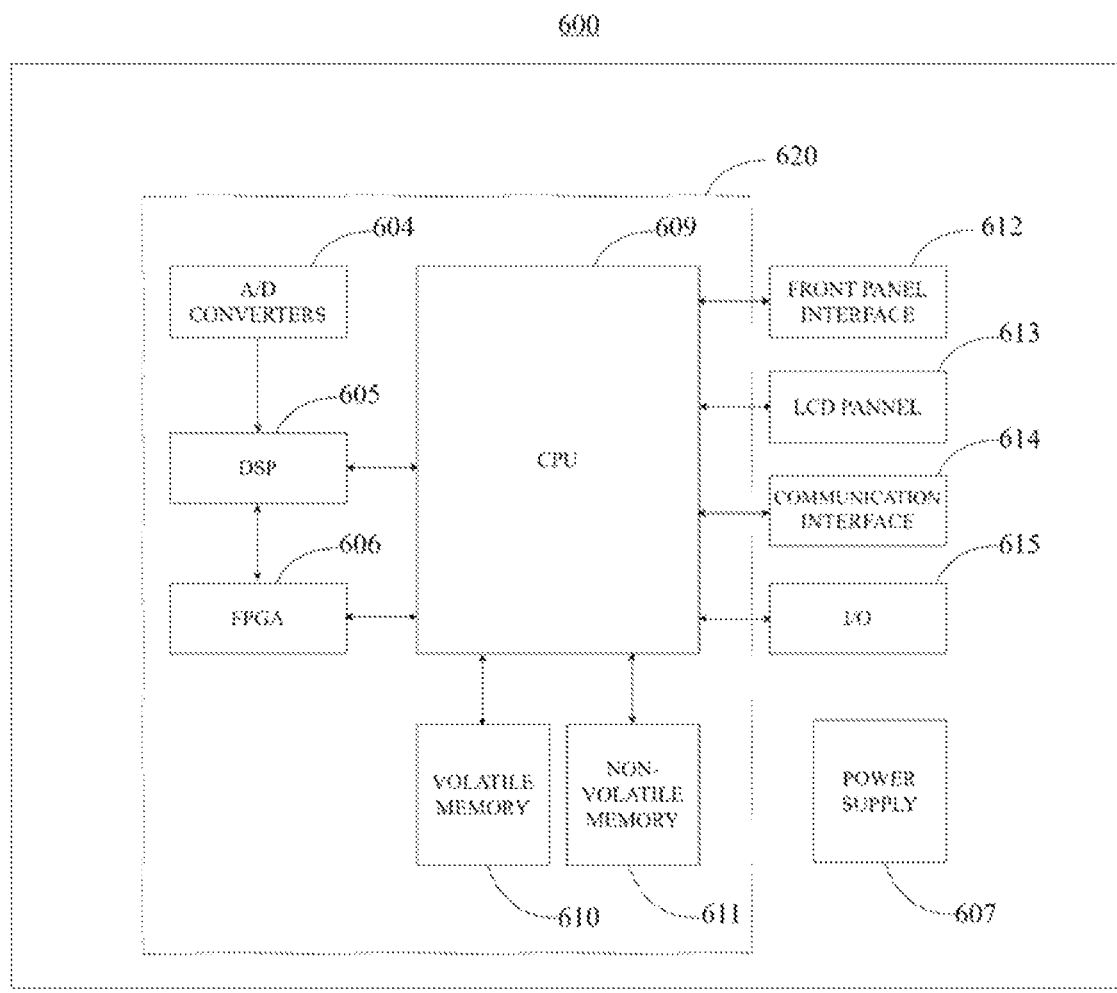
FIG. 6 is a block diagram of a power meter for monitoring power usage and power quality for any metered point within a power system according to some embodiments of the present invention.

FIG. 6 is a block diagram of a power meter 600 for monitoring power usage and power quality for any metered point within a power system.

The power meter 600 illustrated in FIG. 6 includes multiple analog-to-digital (A/D) converters 604, a power supply 607, volatile memory 610, non-volatile memory 611, a front panel interface 612, and a processing module that includes at least one Central Processing Unit (CPU) and/or one or more Digital Signal Processors (DSP), two of which are shown DSP 605 and CPU 609. The power meter 600 also includes a Field Programmable Gate Array (FPGA) 606 which performs several functions, including acting as a communications bridge for transferring data between the various processors (605 and 609).

The output of a current transformer or potential transformer will be coupled with the A/D converters 604 which are configured to convert the analog voltage output from the transformer to a digital signal that can be processed by the DSP 105.

A/D converters 604 are configured to convert an analog voltage output to a digital signal that is transmitted to a gate array, such as Field Programmable Gate Array (FPGA) 606. The digital signal is then transmitted from the FPGA 606 to the CPU 609.

The CPU 609 or DSP Processors 605 are configured to receive digital signals from the A/D converters 604 and perform the necessary calculations to determine power usage and control the overall operations of the power meter 600. In some embodiments, the CPU 609 and DSP 605 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 606. In some embodiments, the digital samples, which are output from the A/D converters 604 are sent directly to the CPU 609, effectively bypassing the DSP 605 and the FPGA 606 as a communications gateway.

The power supply 607 provides power to each component of the power meter 600. In one embodiment, the power supply 607 is a transformer with its primary windings coupled to the incoming power distribution lines to provide a nominal voltage at its secondary windings. In other embodiments, power may be supplied from an independent power source to the power supply 607.

The front panel interface 612 is shown coupled to the CPU 609 which includes indicators, switches, and various inputs. The LCD panel 613 is shown coupled to the CPU 609 for interacting with a user and for communicating events, such as alarms and instructions. The LCD panel 613 may provide information to the user in the form of alpha-numeric lines, computer-generated graphics, videos, animations, etc.

An input/output (I/O) interface 615 may be provided for receiving externally generated inputs from the power meter 600 and for outputting data, such as serial data, to other devices. In one embodiment, the I/O interface 615 may include a connector for receiving various cards and/or modules that increase and/or change the functionality of the power meter 600.

The power meter 600 also includes volatile memory 610 and non-volatile memory 611. The volatile memory 610 will store the sensed and generated data for further processing and for retrieval when requested to be displayed at the power meter 600 or from a remote location. The volatile memory 610 includes internal storage memory, such as Random-Access Memory (RAM). The non-volatile memory 611 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including timestamps), and stored digital samples for later download to a client application, webserver, or PC application.

In a further embodiment, the power meter 600 will include a communication interface 614, also known as a network interface, for enabling communications between the meter, and a remote terminal unit or programmable logic controller and other computing devices, microprocessors, desktop computers, laptop computers, other meter modules, etc. The communication interface 614 may be a modem, Network Interface Card (NIC), wireless transceiver, or other interface. The communication interface 614 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The power meter 600 may communicate to a server or other computing device via the communication interface 614. The power meter 600 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one IED or meter and/or storing data to be retrieved by the IED or meter.

In an additional embodiment, when a power event occurs, such as a voltage surge, voltage sag, or current short circuit, the power meter 600 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 609 to compute other electrical parameters such as harmonics, magnitudes, symmetrical components, and phasor analysis.

In a further embodiment, the power meter 600 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which power meter firmware and/or software can be upgraded. An event command can be issued by a user, on a schedule, or through a digital communication that will trigger the power meter 600 to access a remote server and obtain the new program code. This will ensure that program data will be maintained, assuring the user that all information is displayed identically on all units.

The foregoing description pertains to a general-purpose power meter, designated as element 600, engineered for the measurement of energy consumption. Within this power meter 600, hardware components such as ADC 604, DSP 605, FPGA 606, CPU 609, volatile memory 610, and non-volatile memory 611 collectively constitute the hardware aspect of the measurement module 620. This hardware aspect is integrally described in the context of mechanisms for open circuit and short circuit detection. In addition, the measurement module 620 also encompasses a software aspect, where functional attributes corresponding to these detection mechanisms may be executed either in DSP 605 or CPU 609 via software implementation. Implementation of the measurement module, which includes both hardware and software components, is straightforward for those skilled in the art, thereby obviating the need for further elaboration on this aspect.

Figure 7:
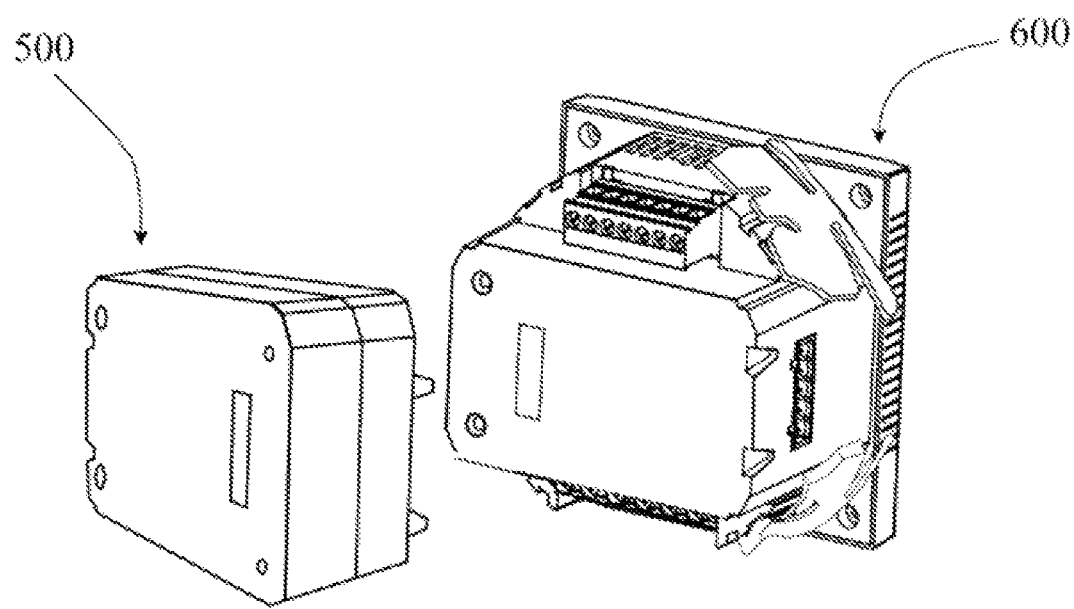
FIG. 7 is a perspective view of an expansion module and a power meter according to some embodiments of the present invention.

FIG. 7 is a perspective view of expansion module 500 and power meter 600, in accordance with one or more embodiments of the present invention. The expansion module 500 is designed to be physically attached to power meter 600, thus facilitating a communication linkage and functional integration between the two devices.

The expansion module 500 comprises a communication interface (not shown in FIG. 7), which may be configured as an I2C interface, allowing the module to receive control signals and parameters from the power meter 600. The alignment and connectivity features, such as mechanical latching or electrical connectors, are designed to ensure a secure and robust connection when the module is attached to the meter.

The power meter 600, in turn, may be configured to recognize the presence of expansion module 500, initializing communication and control protocols that enable the coordinated operation of both devices. This integration enhances the functionality of the system by allowing the power meter 600 to leverage the signal generation capabilities of the expansion module 500.

Together, the expansion module 500 and power meter 600 form a comprehensive system capable of specific tasks such as generating and controlling sinusoidal AC signals at distinct frequencies, monitoring and recording electrical characteristics, and performing adaptive thresholding for short circuit detection. The arrangement illustrated in FIG. 7 underscores the modular nature of the system, allowing for customization, scalability, and flexibility in various applications and environments.

The detailed description above sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. An electricity meter assembly, comprising:
   a sensor module configured to connect to an electrical system, the sensor module incorporating at least one current transformer and/or potential transformer for receiving voltage and current signals from the electrical system, and further configured to generate corresponding measurement signals;
   a meter, including a measurement module operable to receive the measurement signals from the sensor module and generate energy consumption data therefrom, the meter having means for coupling with the sensor module to facilitate a connection between the measurement module and the at least one current transformer and/or potential transformer; the measurement module further configured to determine a short circuit and open circuit conditions of the at least one of current transformer and potential transformer based on a received detection current from a removable expansion module;
   the removable expansion module, comprising a signal generator module, the signal generator module being operable to generate the detection current of a specific frequency, distinct from a frequency of the voltage and current signals from the electrical system, under a guidance of the meter, the removable expansion module further including means for coupling to the sensor module, thereby connecting the signal generator module to the at least one current transformer and/or potential transformer.

2. The electricity meter assembly of claim 1, wherein the removable expansion module is configured to be physically and electrically coupled to a power meter.

3. The electricity meter assembly of claim 1, wherein the removable expansion module is further configured to receive control signals from the meter through a communication interface, and to produce the specified detection current according to these control signals.

4. The electricity meter assembly of claim 3, wherein the communication interface is an I2C interface configured for two-way communication between the power meter and the removable expansion module.

5. The electricity meter assembly of claim 3, wherein the control signals comprise information pertaining to a desired frequency of the detection current.

6. The electricity meter assembly of claim 5, wherein the control signals further include parameters relating to the amplitude of the detection current.

7. The electricity meter assembly of claim 1, wherein the measurement module is further operable to determine the open circuit condition in the at least one current transformer and/or potential transformer by comparing a RMS current, derived from a specific component of the detection current flowing through the power meter, to a near-zero threshold value when the at least one current transformer and/or potential transformer operates under an open circuit.

8. The electricity meter assembly of claim 1, wherein the measurement module is further operable to determine the short circuit condition in the at least one current transformer and/or potential transformer by comparing a RMS current, derived from a specific component of the detection current flowing through the power meter, to a predefined short circuit threshold when the at least one current transformer and/or potential transformer operates under an short circuit.

9. The electricity meter assembly of claim 1, wherein the measurement module includes a threshold determination module that establishes a predefined short circuit threshold for determining the short circuit condition, the threshold being based on a smoothed value derived from the characteristics of a reference current monitored and recorded during normal operational states.

10. The electricity meter assembly of claim 9, wherein the smoothed value is generated by applying a data smoothing algorithm selected from a moving average filter and a Gaussian filter, followed by calculating a Root Mean Square (RMS) current of the reference current.

11. A removable expansion module configured to be physically and electrically attached to a power meter, the removable expansion module comprising:
    a communication interface configured to facilitate bidirectional communication with the power meter, the communication interface operable to receive control signals;
    a Microcontroller Unit (MCU) coupled to the communication interface, operable to receive and process control signals including a desired frequency and amplitude of a sinusoidal alternating current (AC) signal;
    a signal generator, under direct control of the MCU, configured to generate an initial sinusoidal AC signal with a specified amplitude and initial frequency, the signal generator including components for precise sinusoidal waveform generation;
    a frequency control unit configured to receive the initial sinusoidal AC signal from the signal generator and adjust its frequency as instructed by the MCU;
    an output terminal configured to receive the final frequency-modulated sinusoidal AC signal from the frequency control unit and send it to an associated system.

12. The removable expansion module of claim 11, wherein the communication interface is an I2C interface configured for two-way communication between the power meter and the removable expansion module.

* * * * *